(12) United States Patent
Lee

(10) Patent No.: US 7,224,010 B2
(45) Date of Patent: May 29, 2007

(54) VOLTAGE-CONTROLLED AMPLIFIER FOR A SIGNAL PROCESSING SYSTEM

(75) Inventor: Yung-Ming Lee, Taipei Hsien (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 1 day.

(21) Appl. No.: 11/307,469

(22) Filed: Feb. 8, 2006

(65) Prior Publication Data

US 2007/0057296 A1    Mar. 15, 2007

(30) Foreign Application Priority Data

Sep. 14, 2005  (TW) .............................. 94131668 A

(51) Int. Cl.
  *H01L 31/113*  (2006.01)
  *G11C 7/02*  (2006.01)
  *G11C 7/00*  (2006.01)
  *H03F 3/04*  (2006.01)

(52) U.S. Cl. ............ 257/291; 257/379; 365/189.09; 365/196; 365/207; 327/53; 327/56; 330/288; 330/300

(58) Field of Classification Search ........... 257/288, 257/291, 369, 379; 365/177, 196, 189.09, 365/207; 327/53, 56; 330/288, 300
See application file for complete search history.

(56) References Cited

U.S. PATENT DOCUMENTS

| | | | | | |
|---|---|---|---|---|---|
| 4,888,561 | A | * | 12/1989 | Shimokawa et al. | 330/290 |
| 4,890,013 | A | * | 12/1989 | Arcus | 327/53 |
| 5,138,201 | A | * | 8/1992 | Ohbayashi et al. | 327/53 |
| 5,856,748 | A | * | 1/1999 | Seo et al. | 327/53 |
| 5,949,225 | A | * | 9/1999 | Sawtell | 323/284 |
| 6,122,212 | A | * | 9/2000 | Bui et al. | 365/207 |
| 6,442,091 | B2 | * | 8/2002 | Verbeck | 365/208 |
| 7,180,804 | B1 | * | 2/2007 | Luo et al. | 365/208 |

* cited by examiner

*Primary Examiner*—Long K. Tran
(74) *Attorney, Agent, or Firm*—Winston Hsu

(57) ABSTRACT

A voltage-controlled amplifier for a signal processing system includes an input voltage reception end, a first voltage-to-current converter, a reference current generator, a gain adjustment circuit, a first current mirror, and an output circuit. The voltage-controlled amplifier adjusts a gain according to a variable control voltage, so as to transfer an input voltage to an output voltage according to the adjusted gain. When adjusting the gain, the present invention changes only an alternating current part of the input voltage, and can decrease noise, the production cost, and increase integration degree.

8 Claims, 5 Drawing Sheets

VOLTAGE-CONTROLLED AMPLIFIER FOR A SIGNAL PROCESSING SYSTEM

BACKGROUND OF THE INVENTION

1. Field of the Invention

The present invention provides a voltage-controlled amplifier, and more particularly, a voltage-controlled amplifier with low noise, low distortion, high integration degree, and low cost.

2. Description of the Prior Art

A voltage-controlled amplifier, or VCA, can be seen as a three-terminal unit, including an input end, an output end, and a control signal reception end, utilized for changing a gain according to a control signal. The VCA is usually used in a multimedia electric device, such as a DVD player, a VCD player, a portable video player, a digital TV, etc. A user can adjust volume, contrast, brightness, or a channel of the multimedia electric device through the VCA.

The VCA has become more and more important owing to a variety of signal types. The prior art VCAs (voltage-controlled amplifiers) are manufactured with a bipolar process or a BiCMOS (bipolar complementary metal oxide semiconductor) process. A VCA, manufactured with the bipolar process, can operate in a high speed and drive a high current, but cannot be integrated with a digital circuit. In comparison, a VCA, manufactured with the BiCMOS process, combines advantages of a BJT and a CMOS, including high speed, high current driving, low power, high input impedance, high noise margin, etc. However, cost of the BiCMOS manufacturing process is too high. Therefore, a VCA with low noise, low distortion, high integration degree, and low cost is needed.

SUMMARY OF THE INVENTION

It is therefore a primary objective of the claimed invention to provide a voltage-controlled amplifier for a signal processing system.

According to the claimed invention, a voltage-controlled amplifier for a signal processing system comprises an input voltage reception end, a first voltage-to-current converter, a reference current generator, a gain adjustment circuit, a first current mirror, and an output circuit. The input voltage reception end is utilized for receiving an input voltage. The first voltage-to-current converter is coupled to the input voltage reception end, and is utilized for outputting a first current according to the input voltage received by the input voltage reception end. The reference current generator is utilized for generating a second current. The gain adjustment circuit is coupled to the first voltage-to-current converter and the reference current generator, and is utilized for receiving the first current and the second current, and adjusting a gain of the voltage-controlled amplifier. The gain adjustment circuit comprises a first bipolar junction transistor, a second bipolar junction transistor, a third bipolar junction transistor, a fourth bipolar junction transistor, and a control voltage reception circuit. Each of the bipolar junction transistors comprises a collector, a base end, and an emitter. The control voltage reception circuit comprises an end coupled to the base of the second bipolar junction transistor and the base of the third bipolar junction transistor, and the other end coupled to the base of the first bipolar junction transistor and the base of the fourth bipolar junction transistor, for outputting a control voltage. The first current mirror is coupled to the first voltage-to-current converter, the gain adjustment circuit, and the reference current generator, and comprises a reference branch, a drain branch, and a mirror branch. The reference branch is coupled to an output end of the first voltage-to-current converter, and is utilized for transmitting the first current. The drain branch is coupled to the reference current generator, the emitter of the first bipolar junction transistor and the emitter of the second bipolar junction transistor, and is utilized for draining a current equal to the first current from the emitter of the first bipolar junction transistor and the emitter of the second bipolar junction transistor. The mirror branch is coupled to the emitter of the third bipolar junction transistor and the emitter of the fourth bipolar junction transistor, for providing a current equal to the first current for the emitter of the third bipolar junction transistor and the emitter of the fourth bipolar junction transistor. The output circuit is coupled to the gain adjustment circuit, and is utilized for determining a difference value between a current of the collector of the first bipolar junction transistor and a current of the collector of the fourth bipolar junction transistor, for outputting an output voltage. The output voltage outputted from the output circuit is controlled according to the control voltage outputted from the gain adjustment circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
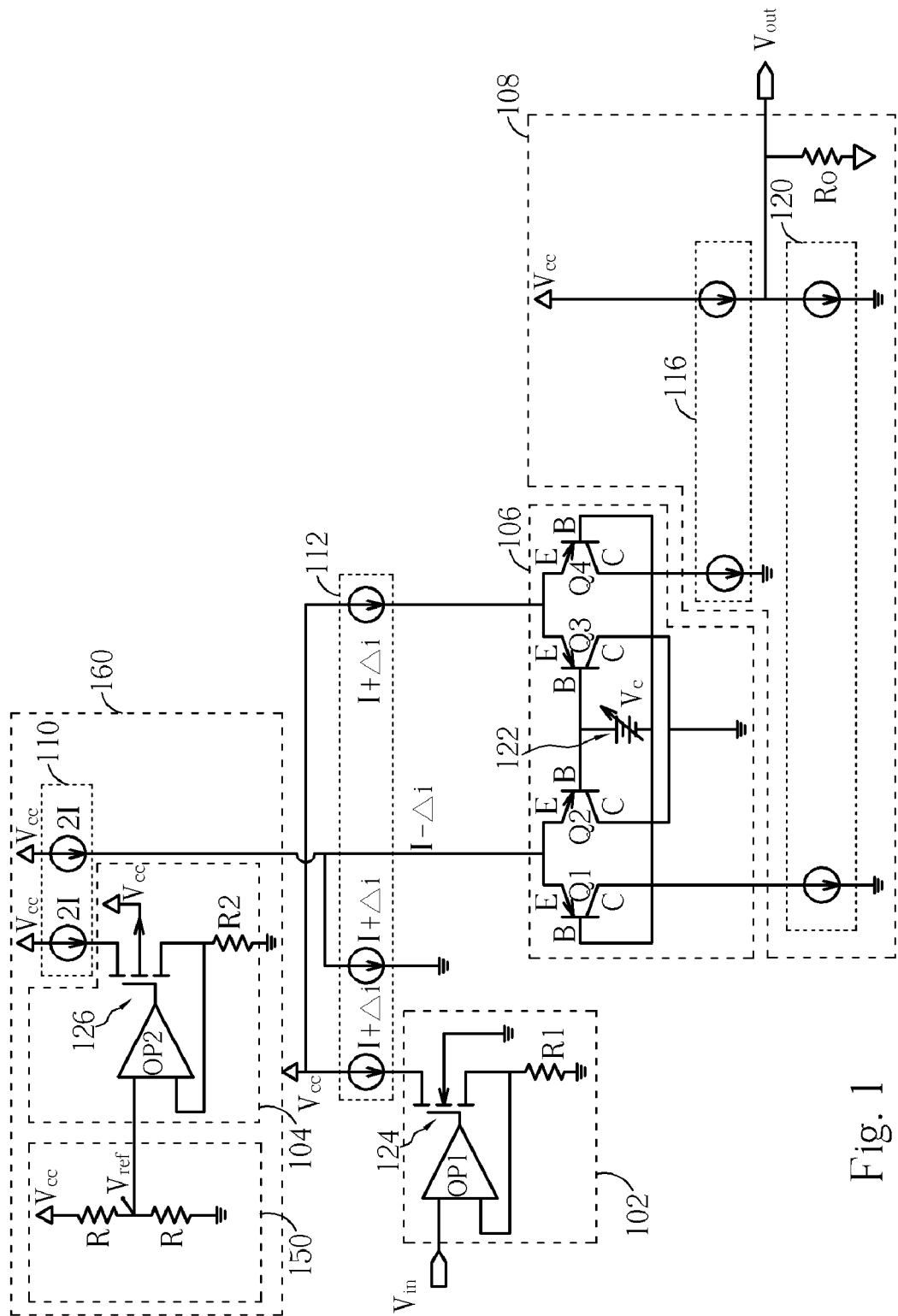
FIG. 1 illustrates a schematic diagram of a VCA in accordance with a preferred embodiment of the present invention.

Please refer to FIG. 1, which illustrates a schematic diagram of a VCA 100 in accordance with a preferred embodiment of the present invention. The VCA 100 includes an input voltage reception end, a first voltage-to-current converter 102, a reference current generator 160, a gain adjustment circuit 106, a first current mirror 112, and an output circuit 108. The VCA 100 can adjust a gain according to a variable control voltage $V_C$, and amplify an input voltage $V_{in}$ received from the input voltage reception end to an output voltage $V_{out}$ with the adjusted gain. When adjusting the gain, the present invention changes an alternating-current (AC) portion of the input voltage $V_{in}$, but does not change a direct-current (DC) portion of the input voltage $V_{in}$. Also, the present invention can decrease noise, distortion, and increase integration degree. The detailed operation of the VCA 100 will be described in the following.

The first voltage-to-current converter 102 includes a first operational amplifier OP1, a NMOSFET (n-type metal oxide semiconductor field effect transistor) 124, and a first resistor R1, utilized for generating a first current according to the input voltage $V_{in}$. The reference current generator 160 includes a second voltage-to-current converter 104, a reference voltage generator 150, and a fourth current mirror 110.

The second voltage-to-current converter 104 includes a second MOS (metal oxide semiconductor) transistor 126, a second operational amplifier OP2, and a second resistor R2, utilized for transforming a reference voltage $V_{ref}$ generated by the reference voltage generator 150 into a second current. The second MOS 126 includes a gate, a source, and a drain. The drain of the second MOS 126 is coupled to a branch of the fourth current mirror 110. The second operational amplifier OP2 includes a first input end coupled to the reference voltage generator 150, a second input end coupled to the source of the second MOS 126, and an output end coupled to the gate of the second MOS 126. The second resistor R2 is coupled between the source of the second MOS 126 and the second input end of the second operational amplifier OP2. In an embodiment, the second MOS 126 is a PMOS-FET (p-type metal oxide semiconductor field effect transistor). The reference voltage generator 150 preferably includes a voltage source and a series of two resistors R coupled to the ground, utilized for generating the reference voltage $V_{ref}$. The fourth current mirror 110 is coupled to the second voltage-to-current converter 104 and the gain adjustment circuit 106, utilized for receiving and transmitting the second current generated by the second voltage-to-current converter 104 to the gain adjustment circuit 106.

The first and second operational amplifiers OP1 and OP2 preferably are manufactured with a CMOS process, so the first and second operational amplifiers OP1 and OP2 have advantages of high input impedance and low thermal noise, which ensures correct operation when the input voltage $V_{in}$ is extremely high, and decreases noise and distortion. The first voltage-to-current converter 102 transforms the input voltage $V_{in}$ into the first current, and the second voltage-to-current converter 104 transforms the reference voltage $V_{ref}$ into the second current. The resistance of the first resistor R1 in the first voltage-to-current converter 102 is twice the resistance of the second resistor R2 in the second voltage-to-current converter 104, so that when a DC level of the input voltage $V_{in}$ equals a DC level of the reference voltage $V_{ref}$, the second current outputted from the second voltage-to-current converter 104 is twice the first current outputted from the first voltage-to-current converter 102. If the input voltage $V_{in}$ includes an AC signal, then the output current of the first voltage-to-current converter 102 includes a difference $\Delta i$. In other words, the second current outputted from the second voltage-to-current converter 104 is 2I, and the first current outputted from the first voltage-to-current converter 102 is (I+$\Delta i$).

Figure 2:
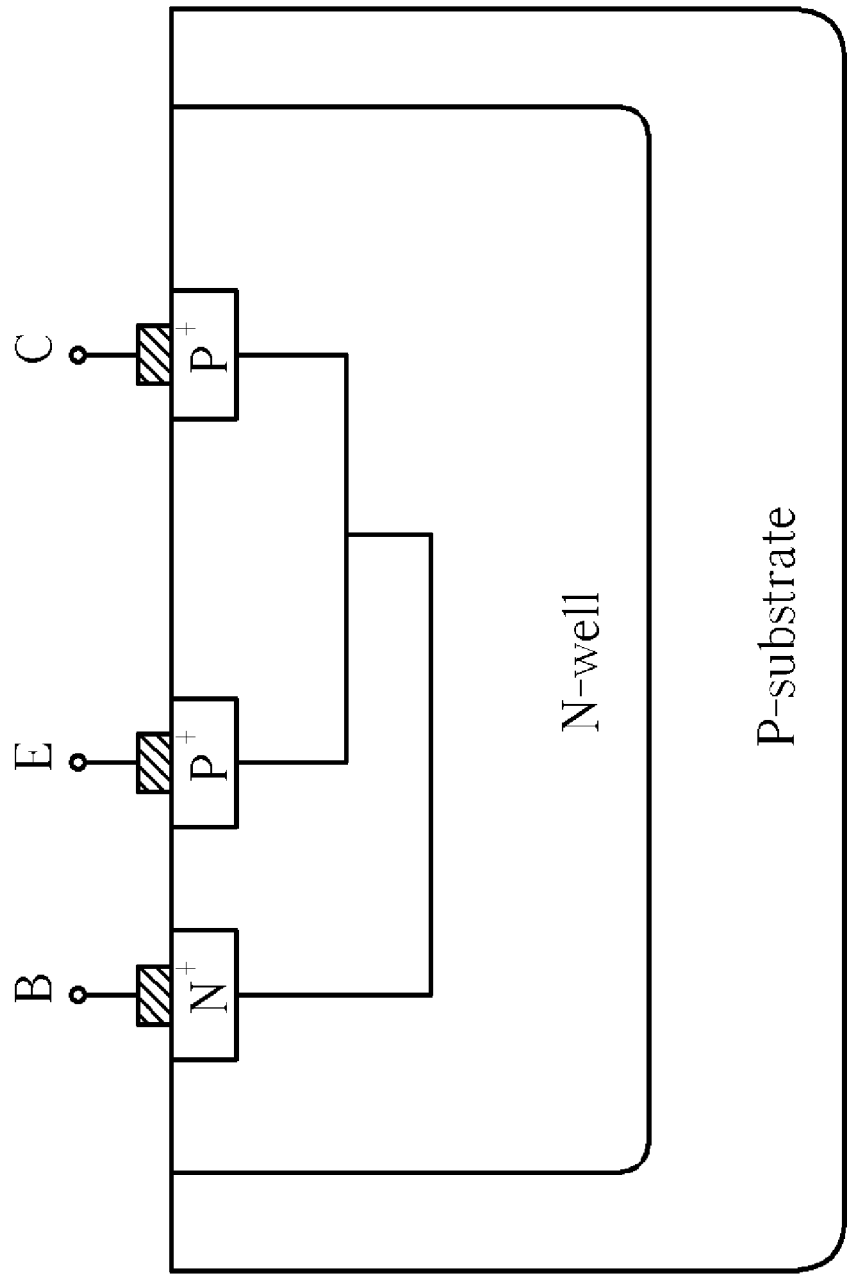
FIG. 2 illustrates a schematic diagram of a prior art parasitic lateral BJT.

The gain adjustment circuit 106 includes first, second, third, and fourth BJTs (bipolar junction transistors) Q1, Q2, Q3, and Q4, and a control voltage reception circuit 122. In order to decrease the production cost, preferably, the first, second, third, and fourth BJTs Q1, Q2, Q3, and Q4 are parasitic lateral BJTs manufactured in a CMOS process. Please refer to FIG. 2, which illustrates a schematic diagram of a prior art parasitic lateral BJT 200. As those skilled in the art recognize, the parasitic lateral BJT 200 includes a p-type extrinsic base, an n-type collector and a p-type extrinsic base of an n-p-n junction. The word "lateral" means that current laterally flows from an emitter to the collector in a silicon crystal surface, resulting in a larger base impedance, fast reaction speed, and facility for combining with other CMOS circuits. Go back to FIG. 1, the second voltage-to-current converter 104 outputs the current 2I to emitters of the first and second BJTs Q1 and Q2. The first voltage-to-current converter 102 outputs the current (I+$\Delta i$) mirrored by the first current mirror 112 to emitters of the third and fourth BJTs Q3 and Q4, and drains the current (I+$\Delta i$) from the emitters of the first and second BJTs Q1 and Q2. Therefore, current flowing into the emitters of the first and second BJTs Q1 and Q2 is (I–$\Delta i$), and current flowing into the emitters of the third and fourth BJTs Q3 and Q4 is (I+$\Delta i$). Suppose that collector currents of the first, second, third, and fourth BJTs Q1, Q2, Q3, and Q4 are $I_{C1}$, $I_{C2}$, $I_{C3}$, and $I_{C4}$, and voltages from bases to emitters of the first, second, third, and fourth BJTs Q1, Q2, Q3, and Q4 are $V_{BE1}$, $V_{BE2}$, $V_{BE3}$, $V_{BE4}$, then:

$$-V_C = V_{BE1} - V_{BE2} = V_T \ln(I_{C1}/I_{C2})$$

$$-V_C = V_{BE3} - V_{BE4} = V_T \ln(I_{C1}/I_{C2})$$

and $$I_{C2} = I - \Delta i - I_{C1}$$

$$I_{C3} = I + \Delta i - I_{C4}$$

so $$-V_C = V_T \ln(I_{C1}/(I - \Delta i - I_{C1}))$$

$$-V_C = V_T \ln(I_{C4}/(I + \Delta i - I_{C4}))$$

then $$I_{C1} = (I - \Delta i)/(1 + \exp(V_C/V_T))$$

$$I_{C4} = (I + \Delta i)/(1 + \exp(V_C/V_T))$$

wherein $V_T$ is thermal voltage

In addition, the output circuit 108 outputs an output current $I_O$ according to the collector currents $I_{C1}$ and $I_{C4}$. The output circuit 108 preferably includes a third current mirror 116, a second current mirror 120, and an output resistor $R_O$. The third current mirror 116 and the second current mirror 120 mirrors the currents $I_{C1}$ and $I_{C4}$ to the output resistor $R_O$ respectively. So, $$I_O = I_{C4} - I_{C1} = (2\Delta i)/(1 + \exp(V_C/V_T))$$

then a gain of the VCA 100 is $$\Delta V_{out}/\Delta V_{in} = (I_O \times R_O)/(\Delta i \times R1) = (R_O/R1) \times (2/(1 + \exp(V_C/V_T)))$$

Therefore, the gain of the VCA 100 changes in response to the control voltage $V_C$. That is, by adjusting the control voltage $V_C$ of the gain adjustment circuit 106, the VCA 100 adjusts the output voltage of the output circuit 108.

Moreover, in the VCA 100, adjusting the control voltage $V_C$ only changes the AC part of the output signal $V_{out}$. Since the first, second, third, and fourth BJTs Q1, Q2, Q3, and Q4 are parasitic lateral BJTs manufactured in the CMOS process, the production cost can be reduced, the base impedances are high, the reaction speed is fast, and it is easy to integrate with the other CMOS circuits. Furthermore, the high input impedance and low thermal noise of the first and second operational amplifiers OP1 and OP2 can bear the high input voltage $V_{in}$ and decrease noise and distortion. Therefore, the VCA 100 is suitable for handling large signals.

Figure 3:
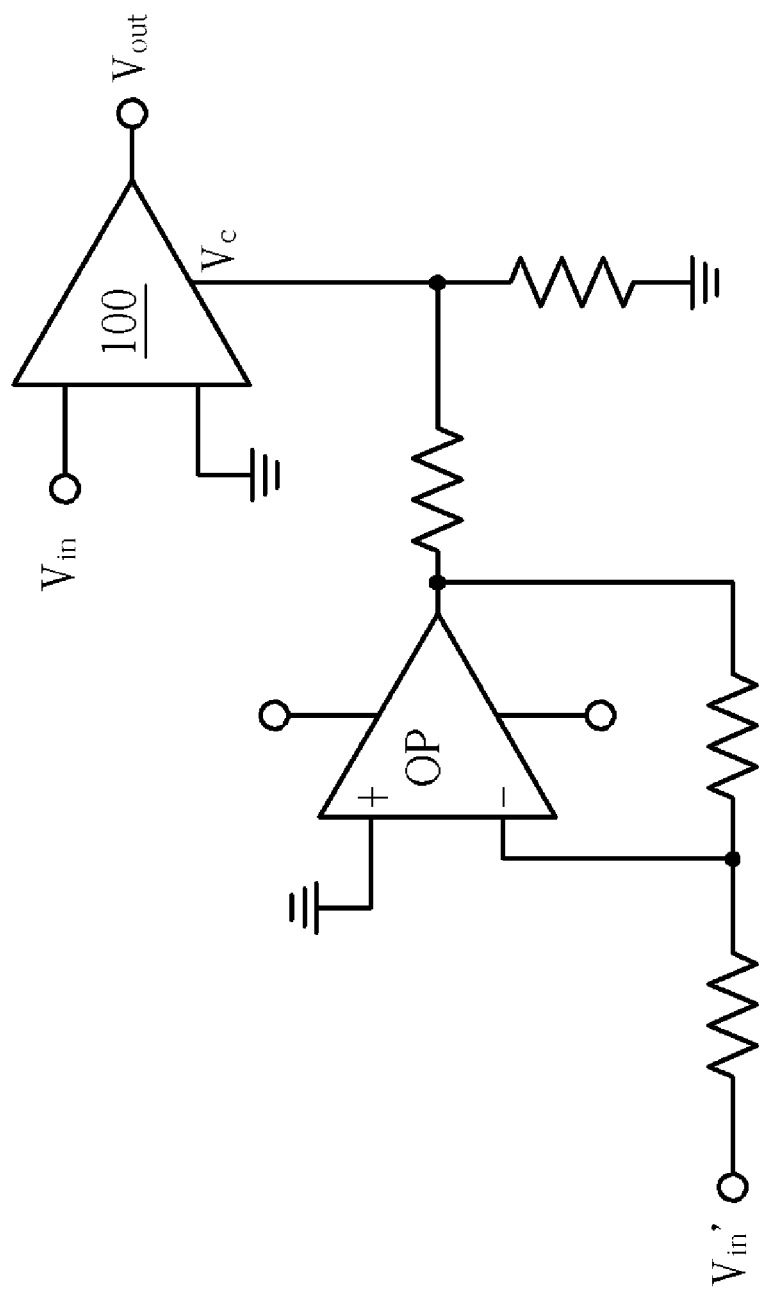
FIG. 3 illustrates a schematic diagram of an exponential amplifier in accordance with the present invention.
Figure 4:
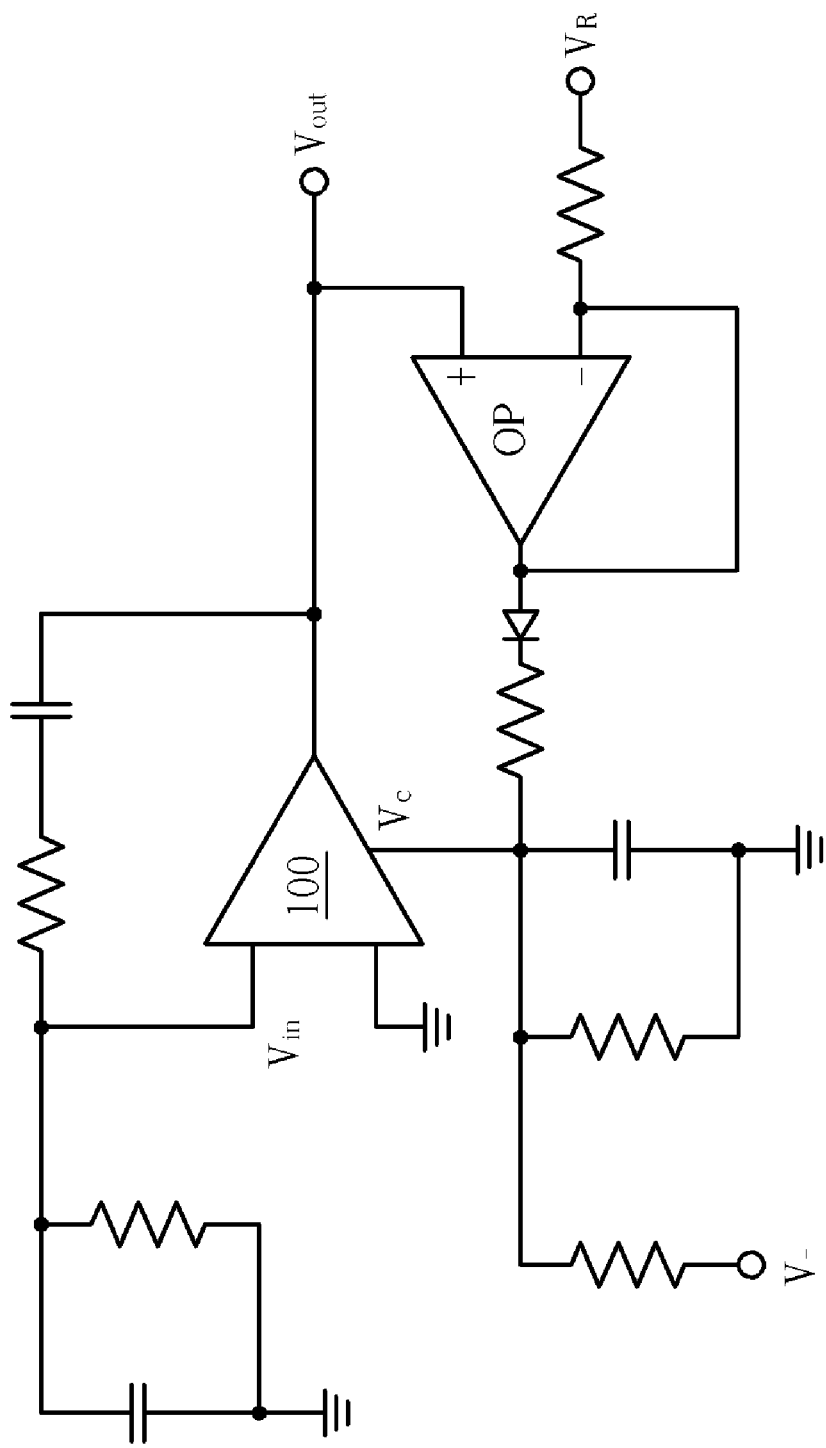
FIG. 4 illustrates a schematic diagram of a stable-amplitude oscillator in accordance with the present invention.
Figure 5:
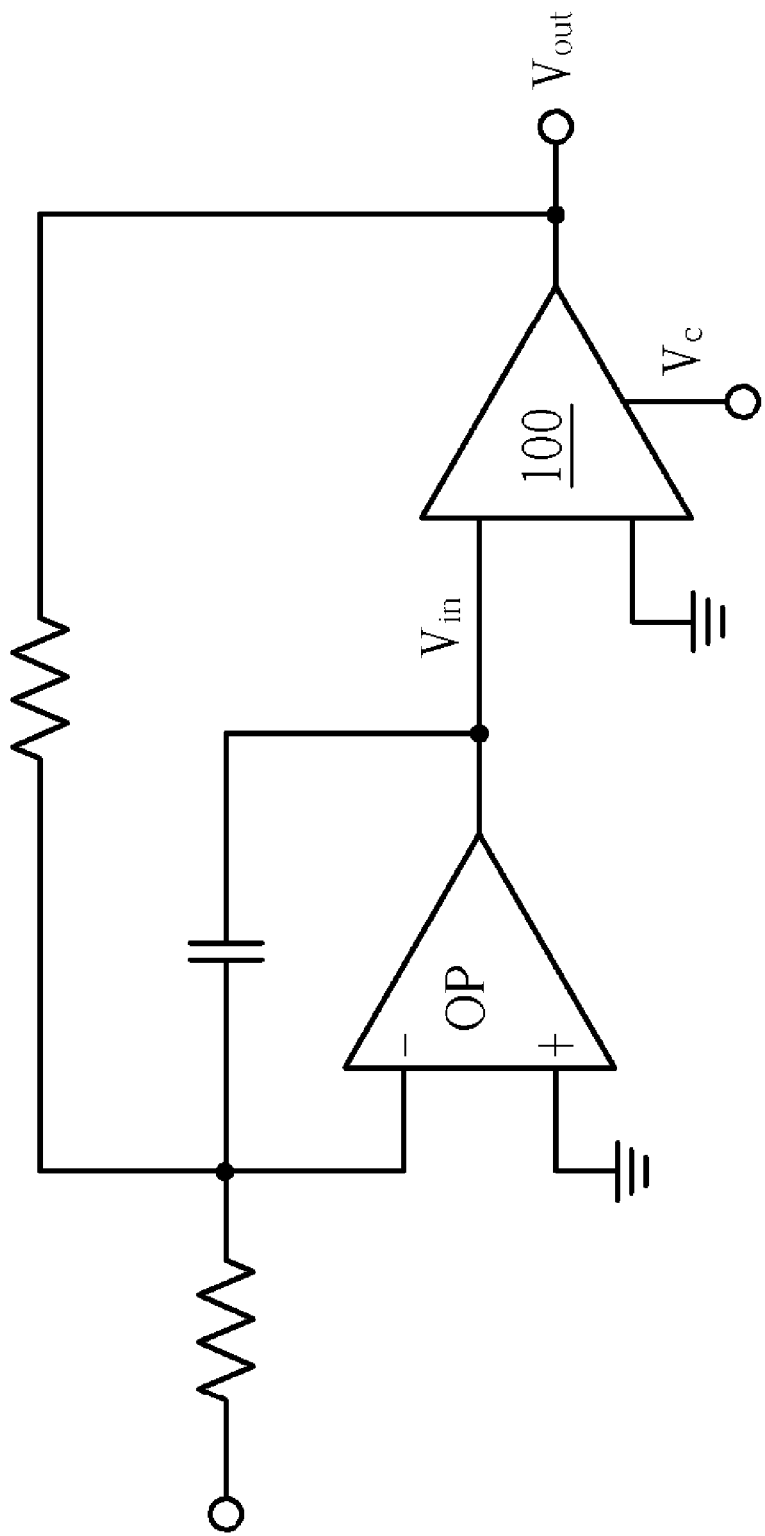
FIG. 5 illustrates an adjustable low-pass filter in accordance with the present invention.

Therefore, those skilled in the art can use the present invention VCA 100 to implement application circuits for decreasing noise, distortion, and cost, and increasing integration degree. For example, please refer to FIG. 3, FIG. 4, and FIG. 5. FIG. 3 illustrates a schematic diagram of an exponential amplifier 300, FIG. 4 illustrates a schematic diagram of a stable-amplitude oscillator 400, and FIG. 5 illustrates an adjustable low-pass filter 500. In FIG. 3, the exponential amplifier 300 receives a reference voltage $V_{in}$ from the input end of the VCA 100, and amplifies an input voltage $V_{in}{}'$ to an exponential time. In FIG. 4, the stable-amplitude oscillator 400 changes the control voltage $V_C$ of the VCA 100 by changing voltages $V_R$ and V−, and outputs an oscillating signal with an amplitude $V_R$ through the output end of the VCA 100. In FIG. 5, by adjusting the control voltage $V_C$ of the VCA 100, the adjustable low-pass filter 500 changes a pass-band width. The circuits in FIG. 3 to 5 are applications of the present invention, and do not limit the present invention.

In summary, the gain of the present invention VCA is changed in response to the control voltage and only amplifies the AC portion of the output signal. Moreover, the BJTs in the gain adjustment circuit are parasitic lateral BJTs manufactured in the CMOS process, so as to decrease noise, distortion, and cost, and increase integration degree. Furthermore, the high input impedance and low thermal noise of the operational amplifiers ensures correct operation when the input voltage is too high, and decreases noise and distortion. Therefore, the present invention VCA combines advantages of low noise, low distortion, low cost, and high integration degree.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage-controlled amplifier for a signal processing system, comprising:
   an input voltage reception end for receiving an input voltage;
   a first voltage-to-current converter coupled to the input voltage reception end, for outputting a first current according to the input voltage received by the input voltage reception end;
   a reference current generator for generating a second current;
   a gain adjustment circuit coupled to the first voltage-to-current converter and the reference current generator, for receiving the first current and the second current, and adjusting a gain of the voltage-controlled amplifier, the gain adjustment circuit comprising:
      a first bipolar junction transistor comprising a collector, a base end, and an emitter;
      a second bipolar junction transistor comprising a collector, a base end, and an emitter;
      a third bipolar junction transistor comprising a collector, a base end, and an emitter;
      a fourth bipolar junction transistor comprising a collector, a base end, and an emitter; and
      a control voltage reception circuit comprising an end coupled to the base end of the second bipolar junction transistor and the base end of the third bipolar junction transistor, and another end coupled to the base end of the first bipolar junction transistor and the base end of the fourth bipolar junction transistor, for outputting a control voltage;
   a first current mirror coupled to the first voltage-to-current converter, the gain adjustment circuit, and the reference current generator, comprising:
      a reference branch coupled to an output end of the first voltage-to-current converter, for transmitting the first current;
      a drain branch coupled to the reference current generator, the emitter of the first bipolar junction transistor and the emitter of the second bipolar junction transistor, for draining a current equal to the first current from the emitter of the first bipolar junction transistor and the emitter of the second bipolar junction transistor; and
      a mirror branch coupled to the emitter of the third bipolar junction transistor and the emitter of the fourth bipolar junction transistor, for providing a current equal to the first current for the emitter of the third bipolar junction transistor and the emitter of the fourth bipolar junction transistor; and
   an output circuit coupled to the gain adjustment circuit, for determining a difference value between a current of the collector of the first bipolar junction transistor and a current of the collector of the fourth bipolar junction transistor, for outputting an output voltage;
   wherein the output voltage outputted from the output circuit is controlled according to the control voltage outputted from the gain adjustment circuit.

2. The voltage-controlled amplifier of claim 1, wherein the second current is about two times the first current.

3. The voltage-controlled amplifier of claim 1, wherein the first bipolar junction transistor, the second bipolar junction transistor, the third bipolar junction transistor, and the fourth bipolar junction transistor are made of parasitic lateral bipolar junction transistors of a process of complementary metal oxide semiconductor transistor.

4. The voltage-controlled amplifier of claim 1, wherein the first voltage-to-current converter comprises:
   a first metal oxide semiconductor transistor comprising a gate, a source, and a drain, the drain coupled to the reference branch of the current mirror;
   a first operational amplifier comprising a first input end coupled to the input voltage reception end, a second input end coupled to the source of the metal oxide semiconductor transistor, and an output end coupled to the gate of the metal oxide semiconductor transistor; and
   a first resistor coupled to the source of the metal oxide semiconductor transistor and the second input end of the operational amplifier.

5. The voltage-controlled amplifier of claim 1, wherein the reference current generator comprises:
   a reference voltage generator for generating a reference voltage;
   a second voltage-to-current converter coupled to the reference voltage generator, for generating the second current according to the reference voltage; and
   a fourth current mirror coupled to the second voltage-to-current converter and the gain adjustment circuit for receiving and transmitting the second current to the gain adjustment circuit.

6. The voltage-controlled amplifier of claim 5, wherein the second voltage-to-current converter comprises:
   a second metal oxide semiconductor transistor comprising a gate, a source, and a drain, the drain coupled to the fourth current mirror, for transmitting the second current to the fourth current mirror;
   a second operational amplifier comprising a first input end coupled to the reference voltage generator, a second input end coupled to the source of the second metal oxide semiconductor transistor, and an output end coupled to the gate of the second metal oxide semiconductor transistor; and a second resistor coupled to the source of the second metal oxide semiconductor transistor and the second input end of the second operational amplifier.

7. The voltage-controlled amplifier of claim 1, wherein the output circuit comprises:
   a second current mirror comprising a first branch coupled to the collector of the first bipolar junction transistor, and a second branch coupled to an output end of the output circuit; and
   a third current mirror comprising a first branch coupled to the collector of the fourth bipolar junction transistor, and a second branch coupled to the output end of the output circuit.

8. The voltage-controlled amplifier of claim 7, wherein the output circuit further comprises an output resistor coupled to the output end.

* * * * *